(12) United States Patent
Inate

(10) Patent No.: US 9,621,127 B2
(45) Date of Patent: Apr. 11, 2017

(54) ELASTIC WAVE DEVICE WITH A BUMP DEFINING A SHIELD AND MANUFACTURING METHOD THEREOF

(71) Applicant: Murata Manufacturing Co., Ltd., Nagaokakyo-shi, Kyoto-fu (JP)

(72) Inventor: Kenji Inate, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/662,285

(22) Filed: Mar. 19, 2015

(65) Prior Publication Data

US 2015/0194947 A1    Jul. 9, 2015

Related U.S. Application Data

(63) Continuation of application No. PCT/JP2013/073619, filed on Sep. 3, 2013.

(30) Foreign Application Priority Data

Sep. 28, 2012 (JP) ................. 2012-216875

(51) Int. Cl.
```
H03H 9/05      (2006.01)
H03H 9/72      (2006.01)
H03H 3/08      (2006.01)
H03H 9/02      (2006.01)
H03H 9/10      (2006.01)
H01L 41/047    (2006.01)
H01L 41/25     (2013.01)
H03H 9/205     (2006.01)
```

(52) U.S. Cl.
CPC ..... *H03H 9/02905* (2013.01); *H01L 41/0472* (2013.01); *H01L 41/25* (2013.01);
(Continued)

(58) Field of Classification Search
CPC .......... H03H 9/02874; H03H 9/02992; H03H 9/0576; H03H 9/059; H03H 9/1085;
(Continued)

(56) References Cited

U.S. PATENT DOCUMENTS 6,756,867 B2 * 6/2004 Takamine ............ H03H 9/0042
                                                      310/313 B
7,053,733 B2 * 5/2006 Yata ..................... H03H 9/0061
                                                      310/313 B
(Continued)

FOREIGN PATENT DOCUMENTS

JP    04-170811 A    6/1992
JP    10-335964 A    12/1998
(Continued)

OTHER PUBLICATIONS

Official Communication issued in International Patent Application No. PCT/JP2013/073619, mailed on Nov. 26, 2013.

*Primary Examiner* — Barbara Summons
(74) *Attorney, Agent, or Firm* — Keating & Bennett, LLP

(57) ABSTRACT

In an elastic wave device, a first electrode structure and a second electrode structure are provided on a piezoelectric substrate, first and second elastic wave element portions are configured by the first electrode structure and the second electrode structure, respectively, and a first bump that is configured of a conductive material to provide shielding is provided on an electrode formation surface of the piezoelectric substrate between the first elastic wave element portion and the second elastic wave element portion.

25 Claims, 5 Drawing Sheets

(52) U.S. Cl.
CPC .......... *H03H 3/08* (2013.01); *H03H 9/02874* (2013.01); *H03H 9/02913* (2013.01); *H03H 9/02992* (2013.01); *H03H 9/059* (2013.01); *H03H 9/0576* (2013.01); *H03H 9/1085* (2013.01); *H03H 9/205* (2013.01); *H01L 2224/16225* (2013.01); *H01L 2924/181* (2013.01); *Y10T 29/42* (2015.01)

(58) Field of Classification Search
CPC ...... H03H 9/205; H03H 3/08; H03H 9/02905; H03H 9/02913; H03H 9/64; H03H 9/725; Y10T 29/42; Y10T 29/49005; H01L 41/0472; H01L 41/25; H01L 41/29; H01L 2224/16225
USPC .......................................... 333/133, 193–195
See application file for complete search history.

(56) References Cited

U.S. PATENT DOCUMENTS

| | | | | |
|---|---|---|---|---|
| 7,298,231 | B2* | 11/2007 | Ikuta ...................... | H03H 9/725 333/133 |
| 7,332,986 | B2* | 2/2008 | Koga ................... | H03H 9/0576 310/313 B |
| 7,400,216 | B2* | 7/2008 | Fuse ...................... | H03H 9/725 333/133 |
| 7,513,022 | B2* | 4/2009 | Shimada .................. | G01H 3/12 29/25.35 |
| 8,004,370 | B2* | 8/2011 | Yamagata .......... | H03H 9/02944 310/313 D |
| 8,049,577 | B2* | 11/2011 | Matsuda ............ | H03H 9/02992 333/133 |
| 2004/0212452 | A1* | 10/2004 | Tsutsumi ............. | H03H 9/0038 333/133 |
| 2007/0229191 | A1 | 10/2007 | Yamaki et al. | |
| 2007/0279156 | A1 | 12/2007 | Pitschi et al. | |
| 2009/0020325 | A1 | 1/2009 | Hammedinger et al. | |

FOREIGN PATENT DOCUMENTS

| | | |
|---|---|---|
| JP | 11-068505 A | 3/1999 |
| JP | 2002-324864 A | 11/2002 |
| JP | 2003-142523 A | 5/2003 |
| JP | 2006-211057 A | 8/2006 |
| JP | 2006-211612 A | 8/2006 |
| JP | 2006-527516 A | 11/2006 |
| JP | 2007-274272 A | 10/2007 |
| JP | 2008-537636 A | 9/2008 |
| JP | 2010-098551 A | 4/2010 |

* cited by examiner

ELASTIC WAVE DEVICE WITH A BUMP DEFINING A SHIELD AND MANUFACTURING METHOD THEREOF

BACKGROUND OF THE INVENTION

1. Field of the Invention

The present invention relates to elastic wave devices including a plurality of elastic wave element portions, such as duplexers, and to manufacturing methods for such elastic wave devices.

2. Description of the Related Art

Elastic wave devices have thus far been widely used as duplexers in cellular phones. For example, Japanese Unexamined Patent Application Publication No. 2010-98551 discloses a duplexer including an elastic wave element portion that configures a transmission filter and an elastic wave element portion that configures a reception filter, disposed on the same piezoelectric substrate. In Japanese Unexamined Patent Application Publication No. 2010-98551, a shield electrode is provided between a portion having the transmission filter and a portion having the reception filter.

According to the duplexer disclosed in Japanese Unexamined Patent Application Publication No. 2010-98551, a shield electrode is formed between the transmission filter and the reception filter. Doing so suppresses electromagnetic field coupling from occurring between the transmission filter and the reception filter. This is intended to improve isolation characteristics.

However, although the shield electrode is provided in the duplexer disclosed in Japanese Unexamined Patent Application Publication No. 2010-98551, the resulting structure still cannot sufficiently suppress the electromagnetic field coupling, and thus the isolation characteristics are still insufficient.

SUMMARY OF THE INVENTION

Preferred embodiments of the present invention provide an elastic wave device, and a manufacturing method thereof, which more effectively prevent electromagnetic field coupling between elastic wave element portions.

An elastic wave device according to a preferred embodiment of the present invention includes a piezoelectric substrate, a first electrode structure, a second electrode structure, and a first bump. The first electrode structure is provided on the piezoelectric substrate and configures a first elastic wave element portion. The second electrode structure is provided on the piezoelectric substrate and configures a second elastic wave element portion. The first bump is provided on the piezoelectric substrate between the first elastic wave element portion and the second elastic wave element portion. The first bump preferably is configured of a conductive material and defines and functions as an electromagnetic shield.

According to a specific aspect of the elastic wave device according to various preferred embodiments of the present invention, a second bump, electrically connected to the first electrode structure or the second electrode structure, to provide an electrical connection to an exterior, is provided. In this manner, in addition to the first bump defining the electromagnetic shield, a second bump providing an electrical connection to the bump may be further provided.

According to another specific aspect of the elastic wave device according to various preferred embodiments of the present invention, the first bump and the second bump are preferably made of the same material.

According to yet another specific aspect of the elastic wave device according to various preferred embodiments of the present invention, a height of the first bump is lower than a height of the second bump.

According to still another specific aspect of the elastic wave device according to various preferred embodiments of the present invention, a maximum diameter of the first bump is smaller than a maximum diameter of the second bump.

According to still another specific aspect of the elastic wave device according to various preferred embodiments of the present invention, the first bump is longer in one direction when viewed from above. In this case, the electromagnetic shield effect is increased even further.

According to still another specific aspect of the elastic wave device according to various preferred embodiments of the present invention, the first bump is grounded. However, the first bump may not be electrically grounded.

According to still another specific aspect of the elastic wave device according to various preferred embodiments of the present invention, a package substrate that is stacked on the piezoelectric substrate so as to be bonded to the second bump is further included.

According to still another specific aspect of the elastic wave device according to various preferred embodiments of the present invention, at least one third elastic wave element portion is configured on the piezoelectric substrate.

According to still another specific aspect of the elastic wave device according to various preferred embodiments of the present invention, the first elastic wave element portion defines and serves as a reception filter portion, and the second elastic wave element portion defines and serves as a transmission filter portion such that a duplexer is configured.

A manufacturing method for an elastic wave device according to another preferred embodiment of the present invention is a method for manufacturing an elastic wave device configured according to various preferred embodiments of the present invention. The manufacturing method according to a preferred embodiment of the present invention includes a step of preparing a piezoelectric substrate, a step of forming the first electrode structure and the second electrode structure on the piezoelectric substrate, and a step of providing the first bump, configured of a conductive material, on the piezoelectric substrate between the first elastic wave element portion and the second elastic wave element portion.

According to another specific aspect of the manufacturing method for an elastic wave device according to various preferred embodiments of the present invention, a step of forming the second bump, electrically connected to the first electrode structure or the second electrode structure, on the piezoelectric substrate, is further included, and the second bump and the first bump are formed at the same time.

According to the elastic wave device of various preferred embodiments of the present invention, the first bump that is configured of a conductive material and defines an electromagnetic shield is provided between the first elastic wave element portion and the second elastic wave element portion, and the first bump has a significantly greater height than an electrode film. Accordingly, electromagnetic field coupling between the first elastic wave element portion and the second elastic wave element portion of the elastic wave device is effectively prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of various preferred embodiments of the present invention with reference to the drawings.

Figure 1A:
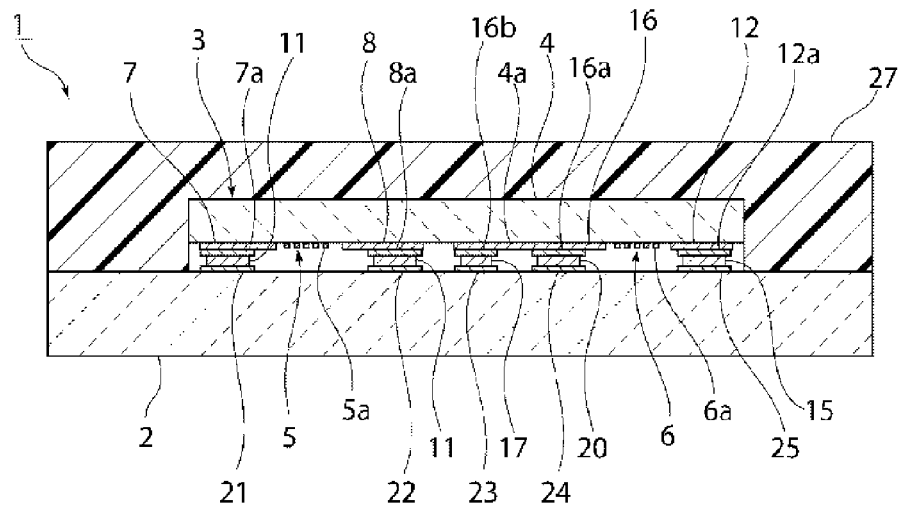
FIG. 1A is a forward cross-sectional view of an elastic wave device according to a preferred embodiment of the present invention.
Figure 1B:
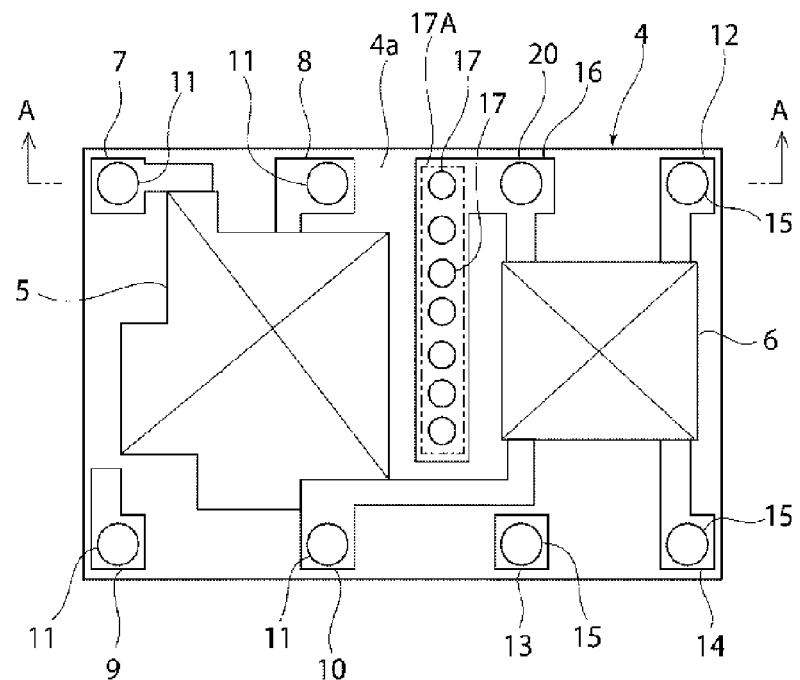
FIG. 1B is a schematic plan view illustrating an electrode formation surface on an elastic wave element chip used in the elastic wave device according to the present preferred embodiment of the present invention.

FIG. 1A is a forward cross-sectional view illustrating an elastic wave device according to a preferred embodiment of the present invention. FIG. 1B is a plan view illustrating an electrode structure on a bottom surface of an elastic wave element chip used in an elastic wave device 1 according to the present preferred embodiment.

The elastic wave device 1 according to the present preferred embodiment is preferably used as a duplexer in a cellular phone, for example.

The elastic wave device 1 includes a package substrate 2. The package substrate 2 preferably is made from a suitable insulative ceramic material such as alumina, a synthetic resin, or the like. An elastic wave element chip 3 is mounted to a top surface of the package substrate 2 through a flip-chip bonding (FCB) technique. The elastic wave element chip 3 includes a piezoelectric substrate 4. The piezoelectric substrate 4 can be configured of a piezoelectric single-crystal such as $LiTaO_3$ or $LiNbO_3$, or of piezoelectric ceramics.

A bottom surface of the piezoelectric substrate 4 defines and serves as an electrode formation surface 4a. FIG. 1B is a schematic plan view illustrating electrode structures on the electrode formation surface 4a. A first electrode structure and a second electrode structure 6 are provided on the electrode formation surface 4a. The first electrode structure 5 configures a transmission filter of the duplexer. Although not illustrated in detail in FIG. 1B, the first electrode structure 5 preferably includes a ladder filter that includes a plurality of elastic wave surface acoustic wave resonators. The circuit configuration of this ladder filter is preferably based on a known ladder filter.

Note that in FIG. 1A, a portion of a single interdigital transducer electrode 5a included in the first electrode structure 5 is illustrated in a general manner.

Electrode lands 7 to 10 are provided on the electrode formation surface 4a so as to be electrically connected to the first electrode structure 5. Second bumps 11 are provided on the respective electrode lands 7 to 10.

Meanwhile, the second electrode structure 6 configures a reception filter of the duplexer. The reception filter has a circuit configuration that uses a longitudinally coupled resonator-type elastic wave filter. Although not illustrated in detail in FIG. 1B, the second electrode structure 6 preferably is configured based on a known longitudinally coupled resonator-type elastic wave filter device.

Note that a portion of an interdigital transducer electrode 6a of the longitudinally coupled resonator-type elastic wave filter included in the second electrode structure 6 is illustrated in FIG. 1A.

Electrode lands 12 to 14 and 16 are provided so as to be electrically connected to the second electrode structure 6. Second bumps 15 and 20 are provided on the respective electrode lands 12 to 14 and 16.

As described above, in the present preferred embodiment, a first elastic wave element portion that defines and serves as the transmission filter and the reception filter that defines serves as a second elastic wave element portion are configured on the electrode formation surface 4a in the elastic wave element chip 3.

One of the unique characteristics of the present preferred embodiment is that a plurality of first bumps 17 are provided between the first electrode structure 5 and the second electrode structure 6, or in other words, between the first elastic wave element portion and the second elastic wave element portion. The first bumps 17 are configured of a suitable conductive material such as Au, Ag, or the like. Preferably, the first bumps 17 are preferably made of the same metal material as the second bumps 11, 15, and 20. Doing so enables the second bumps 11, 15, and 20 and the first bumps 17 to be formed using the same material, which reduces costs. Doing so also enables the bumps to be formed at the same time, which also reduces costs.

Note that the first bumps 17 are provided on the electrode land 16, as illustrated in FIGS. 1A and 1B. The electrode land 16 is configured of a suitable metal film, in the same manner as the other electrode lands 12 to 14. Furthermore, pad layers 16a and 16b are stacked on the electrode land 16 configured of the metal film, as shown in FIG. 1A. The first bumps 17 and the second bump 20 are provided on the pad layers 16b and 16a, respectively.

The first bumps 17 have a sufficient height relative to the electrode film, or in other words, to the metal film, and are bonded to an electrode land 23 of the package substrate 2. The configuration is thus such that the first bumps 17, which are configured of a conductive material, are provided to shield the height dimension of a hollow area between the package substrate 2 and the elastic wave element chip 3, which makes it possible to effectively prevent electromagnetic field coupling between the first electrode structure 5 and the second electrode structure 6.

Furthermore, in the particular case where the plurality of first bumps 17 are disposed so as to be distributed along a straight line extending in a direction perpendicular or substantially perpendicular to a direction connecting the first and second electrode structures 5 and 6, such as the case where, for example, the plurality of first bumps 17 are disposed on the piezoelectric substrate 4 which is sandwiched between the first electrode structure 5 and the second electrode structure 6, electromagnetic field coupling between the first electrode structure 5 and the second electrode structure 6 is even more effectively reduced or prevented. For example, the plurality of first bumps 17 may be disposed along a straight line as shown in FIG. 1B. Of course, the manner in which the plurality of first bumps 17 are disposed is not limited to that described above; the plurality of first bumps 17 may be disposed along a curve, and may be disposed so that at least some of the bumps are coupled together as continuous bumps.

Furthermore, as indicated by the dot-dash line in FIG. 1B, a bump 17A may be formed so as to have a linear shape when the piezoelectric substrate 4 is viewed from above. It is preferable for the linear-shaped bump 17A to be provided across the entire length of the region between the first electrode structure 5 and the second electrode structure 6, but without making contact with the electrode lands 7 to 10 and 12 to 14 that are connected to another potential. As described above, it is desirable for the shape to be linear, or in other words, to have a lengthwise direction, as with the bump 17A. This makes it possible to prevent an electromagnetic field from propagating through gaps between the bumps 17, which in turn makes it possible to even more effectively prevent electromagnetic field coupling.

Note that the shape of the linear-shaped bump 17A when viewed from above is not limited to a straight line, and may be a bent shape, a curved shape, or the like, so as to accommodate the shapes in which the first and second electrode structures are disposed.

Here, pad layers 7a and 8a may be provided on the electrode lands 7 and 8, as shown in FIG. 1A.

In addition, pad layers 12a, 16a, and 16b may be provided on the electrode lands 12 and 16.

As shown in FIG. 1A, the elastic wave element chip 3 is mounted on the package substrate 2 so that the electrode formation surface 4a opposes the package substrate 2. Electrode lands 21 to 25 are provided on the top surface of the package substrate 2. The second bumps 11 or the second bumps 15 and 20 are bonded to the electrode lands 21, 22, 24, and 25. On the other hand, the first bumps 17 are bonded to the electrode land 23. Accordingly, the elastic wave element chip 3 is strongly bonded to the package substrate 2 using the first bumps 17 defining shields. This makes it possible to increase the strength of the bond.

In order to easily and reliably bond the elastic wave element chip 3 to the package substrate 2, it is desirable for the height of the first bumps 17, in the direction viewing the electrode formation surface 4a from above, to be lower than the height of the second bumps 11 and 15 relative to the electrode formation surface 4a. If the height of the first bumps 17 is greater than the height of the second bumps 11 and 15, there is a risk that areas where an electrical connection cannot be established will arise between the second bumps 11 and 15 and the package substrate 2 due to the first bumps 17 and the package substrate 2 making contact during the process to bond the elastic wave element chip 3 to the package substrate 2. However, if the height of the first bumps 17 is relatively lower, an electrical connection and a mechanical bond is established by the second bumps 11 and 15 with certainty.

In addition, as indicated schematically in FIG. 1B, in the case where the shapes of the first bumps 17 and the second bumps 11 and 15 when viewed from above, or in other words, the cross-sectional shape of the bumps when the bumps are cut in a direction parallel or substantially parallel to the electrode formation surface 4a, are circular or approximately circular, if a maximum diameter of the bumps is taken as the diameter of a circle that circumscribes the cross-sectional surface of the bumps where the surface area thereof is maximum, it is desirable for the maximum diameter of the first bumps 17 to be smaller than the maximum diameter of the second bumps 11 and 15. In this case, the surface area of a portion where a plurality of the first bumps 17 are connected is reduced, which in turn makes it possible to achieve greater miniaturization. In the case where the first and second bumps have spherical or approximately spherical shapes and are made of solder, the height of the first bumps 17 is easily made lower than the height of the second bumps by forming the first bumps and the second bumps with the maximum diameter relationship described above using a variable amount of solder or the like. Note that in the case where a plurality of adjacent bumps are configured so as to be connected to each other, the greater of the maximum diameter of the bumps prior to the connection and a maximum width of the connected bumps in a direction that is perpendicular or substantially perpendicular to the direction of the connection and is parallel or substantially parallel to the electrode formation surface 4a is taken as the maximum diameter of the bumps.

Meanwhile, in the present preferred embodiment, the electrode land 16 is electrically connected to a portion of the second electrode structure 6 that is grounded. Accordingly, the electrode land 16 is electrically connected to the second bump 20, which is grounded. The bump 20 provided above the electrode land 16 is electrically connected to the electrode land 24, which is provided on the package substrate 2 and is shunted to ground.

Accordingly, in the present preferred embodiment, a configuration is such that the first bumps 17 are electrically grounded. By electrically grounding the plurality of first bumps 17, a shield effect is further effectively increased. However, in the present invention, it is not absolutely necessary that the first bumps be electrically grounded. That is, the first bumps 17 may be configured as open electrodes that are not grounded.

As shown in FIG. 1A, in the elastic wave device 1, a resinous housing 27 preferably covers the elastic wave element chip 3 on the package substrate 2. The resinous housing 27 is preferably made from a suitable synthetic resin such as an acrylic resin, a urethane resin, a silicone resin, an epoxy resin, or the like. The humidity resistance and the like of the elastic wave device is increased by forming the resinous housing 27.

Note that in the preferred embodiment described above, the second bumps 11, 15, and 20 preferably are provided in addition to the first bumps 17, and an electrical connection between the elastic wave element chip 3 and the exterior is achieved by the second bumps 11, 15, and 20. However, in the present invention, the second bumps 11, 15, and 20 need not be provided. That is, the first and second electrode structures 5 and 6 of the elastic wave element chip 3 may be electrically connected to the exterior using a bonding wire or the like. In other words, any configuration may be used as long as the first bumps 17 are provided as shield bumps between the first and second electrode structures 5 and 6.

Furthermore, although the above preferred embodiment describes an example in which the elastic wave device 1 is applied in a duplexer 2, the present invention is not intended to be limited to duplexers. In other words, various preferred embodiments of the present invention are broadly applicable to elastic wave devices in which a first elastic wave element portion and a second elastic wave element portion are configured on a piezoelectric substrate. At least one third elastic wave element portion may be configured on the piezoelectric substrate in addition to the first elastic wave element portion and the second elastic wave element portion as well.

Further still, the first elastic wave element portion and second elastic wave element portion are not limited to portions that configure band-pass filters, and may configure other elastic wave element portions such as elastic wave resonators, elastic wave delay lines, or the like.

Next, a non-limiting example of a manufacturing method of the elastic wave device 1 according to another preferred embodiment of the present invention will be described with reference to FIGS. 2 and 3.

Figure 2A:
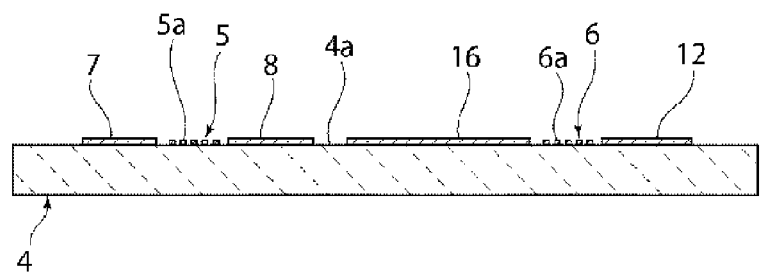
FIG. 2A to FIG. 2D are forward cross-sectional views illustrating a manufacturing method of an elastic wave device according to a preferred embodiment of the present invention.

First, as shown in FIG. 2A, the first and second electrode structures 5 and 6 and the electrode lands 7, 8, 12, and 16 are formed on the piezoelectric substrate 4. Note that FIG. 2A illustrates only a portion that follows an A-A line in FIG. 1B, in the same manner as FIG. 1A.

Figure 2B:
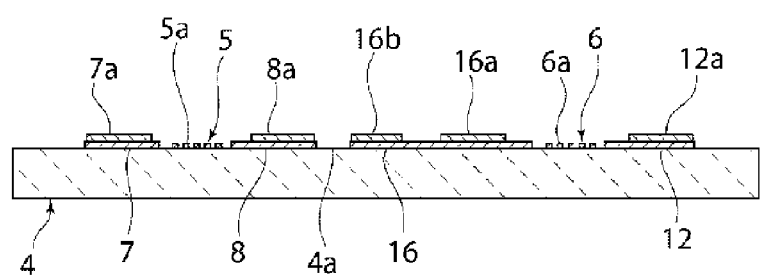

Next, as shown in FIG. 2B, the pad layers 7a, 8a, 12a, 16a, and 16b are formed on the electrode lands 7, 8, 12, and 16, in order to achieve an effect of increasing the bonding strength between the electrodes and the bumps, lower the wiring resistance, or the like.

The method for forming the first and second electrode structures 5 and 6 and the electrode lands 7, 8, 12, and 16, as well as the pad layers 7a, 8a, 12a, 16a, and 16b, is not particularly limited. Any suitable method can be used, including deposition, plating, sputtering, or the like. A variety of other methods, including a patterning method, a method that uses photolithography, a suitable etching method, or the like, can be used as well.

Figure 2C:
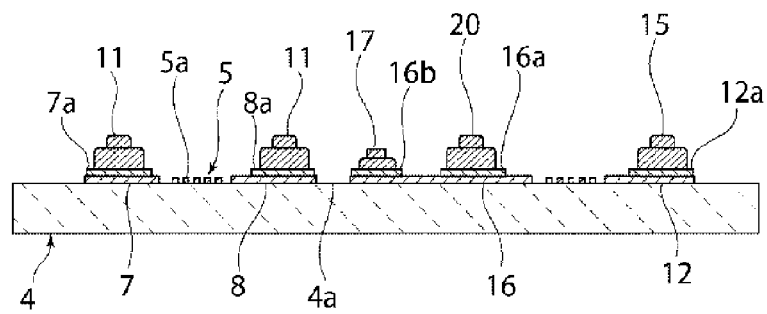

As shown in FIG. 2C, the second bumps 11, 15, and 20 or the first bumps 17 are then formed on the pad layers 7a, 8a, 12a, 16a, and 16b. The second bumps are configured of the same metal material in the present preferred embodiment. Accordingly, the first bumps 17 and the second bumps 11, 15, and 20 can be formed simultaneously in the same step shown in FIG. 2C. Note that in FIG. 2C, the height of the first bumps 17 is lower than the height of the second bumps 11, 15, and 20 in the direction viewing the piezoelectric substrate 4 from above.

Figure 2D:
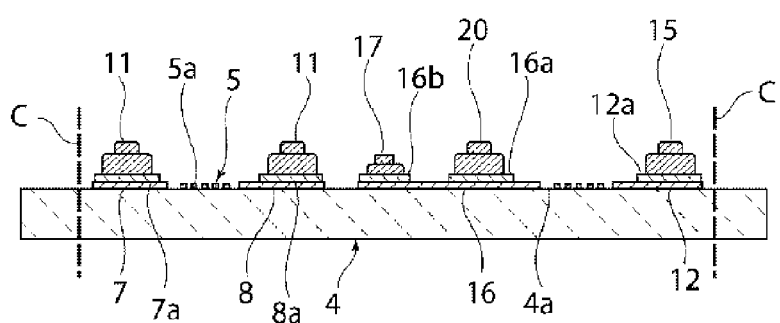

Note that the steps up until that shown in FIG. 2C are carried out on a mother piezoelectric substrate. Accordingly, the mother piezoelectric substrate is cut into individual piezoelectric substrates 4 along broken lines C and C, as shown in FIG. 2D. Doing so makes it possible to form the piezoelectric substrate 4 for a single elastic wave device 1, the electrode structures on the piezoelectric substrate 4, and so on.

Figure 3:
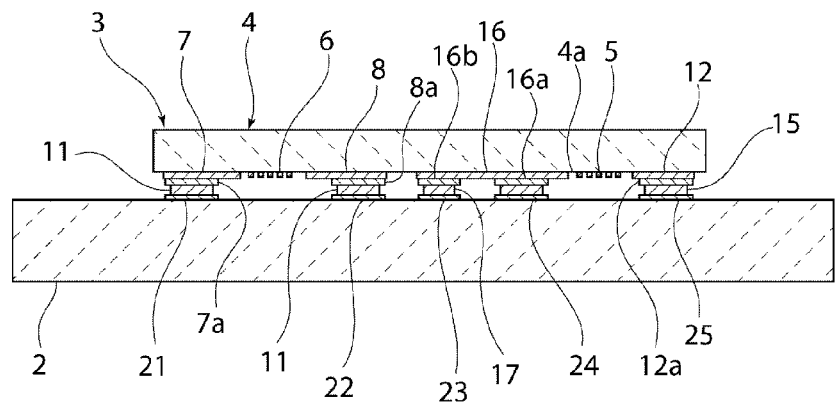
FIG. 3 is a forward cross-sectional view illustrating a manufacturing method of an elastic wave device according to a preferred embodiment of the present invention.

After this, the elastic wave element chip 3 obtained as described above is mounted on the package substrate 2 through a flip-chip bonding technique, as shown in FIG. 3. Finally, the resinous housing 27 is formed so as to cover the elastic wave element chip 3. The elastic wave device 1 preferably is obtained in this manner.

Figure 4:
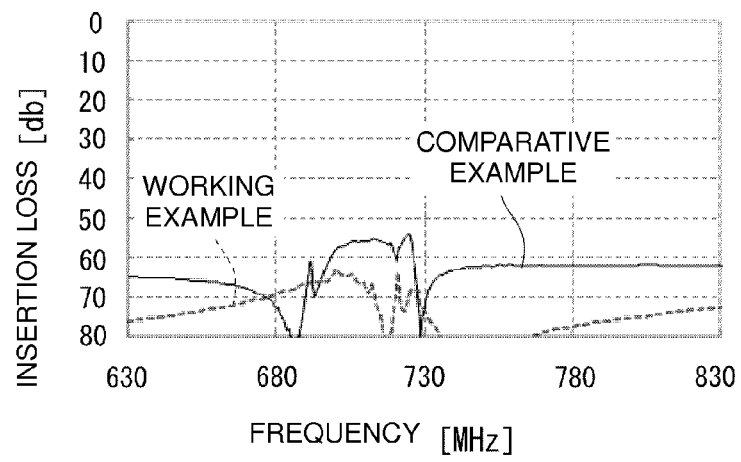
FIG. 4 is a graph illustrating common-mode isolation characteristics in an example of an elastic wave device according to a first working example of various preferred embodiments of the present invention and in an elastic wave device according to a comparative example.
Figure 5:
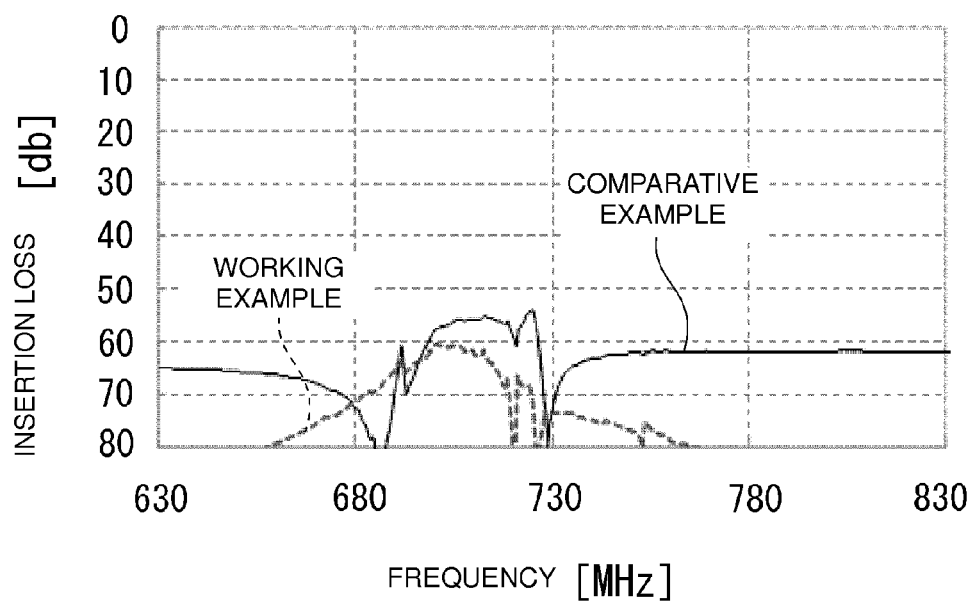
FIG. 5 is a graph illustrating common-mode isolation characteristics in another example of an elastic wave device according to the first working example of various preferred embodiments of the present invention and in an elastic wave device according to a comparative example.
Figure 6:
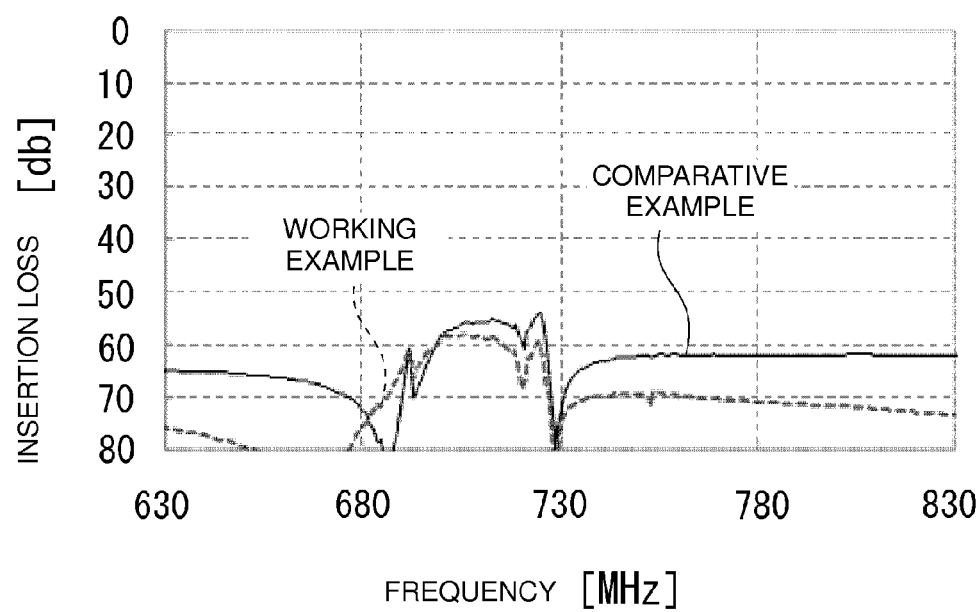
FIG. 6 is a graph illustrating common-mode isolation characteristics in yet another example of an elastic wave device according to the first working example of various preferred embodiments of the present invention and in an elastic wave device according to a comparative example.

FIGS. 4 to 6 are graphs illustrating common-mode isolation characteristics in the elastic wave device according to a first working example of various preferred embodiments of the present invention and in an elastic wave device according to a comparative example.

In FIG. 4, in the first working example, the maximum diameter of the first bumps is set to about 70 μm, and the plurality of first bumps are formed in a continuous manner. In other words, a plurality of adjacent first bumps are formed so as to be continuous, with no gaps therebetween. To rephrase, the ratio of a gap between adjacent first bumps to the maximum diameter of the first bumps is 0.00. The comparative example is the same as the working example, except that the first bumps are not formed. A broken line in FIG. 4 represents a result of the working example, whereas a solid line indicates a result of the comparative example.

As can be seen in FIG. 4, the common-mode isolation characteristics are significantly improved in the working example as compared to the comparative example.

In FIG. 5, an interval between adjacent first bumps is set to about 30 μm, and a plurality of first bumps having a maximum diameter of about 70 μm are formed continuously so that gaps are present therebetween. To rephrase, the ratio of a gap between adjacent first bumps to the maximum diameter of the first bumps is about 0.43. The comparative example is the same as the working example, except that the first bumps are not provided.

The characteristics represented by the broken line in FIG. 5 have a lower attenuation than in the characteristics represented by the broken line in FIG. 4. However, as can be seen from the characteristics represented by the broken line in FIG. 5, the common-mode isolation characteristics is greatly improved over the comparative example even in the case where there is an approximately 30 μm interval between the first bumps.

A broken line in FIG. 6 indicates the common-mode isolation characteristics in a working example in which the first bumps, which have a maximum diameter of about 70 μm, are formed continuously, with an interval between adjacent first bumps being about 50 μm. To rephrase, the ratio of a gap between adjacent first bumps to the maximum diameter of the first bumps is about 0.71. A solid line indicates the common-mode isolation characteristics in a comparative example that is the same as the working example, except that the first bumps are not formed. In the characteristics indicated by the broken line in FIG. 6, there is a lower attenuation than in the common-mode isolation characteristics in the working example shown in FIG. 5, in which there is an interval of about 30 μm. However, it can be seen that the working example greatly improves the common-mode isolation characteristics over the comparative example even in the case where there is an approximately 50 μm interval between the first bumps.

Although the present preferred embodiment describes the height of the first bumps 17 as being lower than the height of the second bumps 11, 15, and 20, the first bumps are heated and melted during the bonding process in the case where the first bumps are formed using solder. The bumps are then cooled and harden thereafter. Meanwhile, in the case where the first bumps are formed of a metal whose primary component is Au, Ag, Cu, or the like, after the second bumps have been bonded to the electrode lands of the package substrate 2 under pressure and crushed during the flip-chip bonding, the first bumps 17 also make contact with the electrode land 24 on the package substrate 2 side. As a result, the first bumps 17 are also bonded to the electrode land 3 on the package substrate 2 side, as shown in FIGS. 1A and 3, in any case. In other words, in the present preferred embodiment, the height of the first bumps 17 is set to be slightly lower than the height of the second bumps 11, 15, and 20 so as not to interfere with the bonding of the second bumps 11, 15, and 20, but so as for the first bumps 17 to be able to still fulfill their bonding function.

Note that the height of the first bumps 17 prior to the flip-chip bonding may be set to about 50% to about 80% of the height of the second bumps 11, 15, and 20, in accordance with the material, shapes, and so on of the bumps. Setting the height of the first bumps to be lower than the second bumps prior to the FCB process makes it possible to reduce the surface area of the bond between the first bumps and the electrode lands on the package substrate side and reduce an amount of increase in the surface area of the electrode formation surface 4a occupied by the first bumps after the bonding. This is accordingly useful for miniaturizing the elastic wave device.

A suitable metal that is bonded to the electrode lands on the package substrate side by applying ultrasound vibrations in a pressurized state preferably is used as the second bumps or the first bumps in the preferred embodiment. Bumps that have Au, Ag, Cu, or the like as their primary component preferably also may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   a first electrode structure provided on the piezoelectric substrate and defining a first elastic wave element portion;
   a second electrode structure provided on the piezoelectric substrate and defining a second elastic wave element portion;
   a first bump provided on the piezoelectric substrate between the first elastic wave element portion and the second elastic wave element portion, and configured of a conductive material to define a shield; and
   a second bump electrically connected to the first electrode structure or the second electrode structure to provide an electrical connection to an exterior; wherein
   a height of the first bump is lower than a height of the second bump.

2. The elastic wave device according to claim 1, wherein the first bump and the second bump are made of a same material.

3. The elastic wave device according to claim 1, wherein a maximum diameter of the first bump is smaller than a maximum diameter of the second bump.

4. The elastic wave device according to claim 1, wherein the first bump is longer in one direction when viewed from above.

5. The elastic wave device according to claim 1, wherein the first bump is grounded.

6. The elastic wave device according to claim 1, further comprising a package substrate that is stacked on the piezoelectric substrate and bonded to the second bump.

7. The elastic wave device according to claim 1, wherein at least one third elastic wave element portion is configured on the piezoelectric substrate.

8. The elastic wave device according to claim 1, wherein the first elastic wave element portion defines a reception filter portion, and the second elastic wave element portion defines a transmission filter portion so as to provide a duplexer.

9. A manufacturing method for the elastic wave device according to claim 1, the method comprising:
   a step of preparing the piezoelectric substrate;
   a step of forming the first electrode structure and the second electrode structure on the piezoelectric substrate; and
   a step of forming the first bump of the conductive material on the piezoelectric substrate between the first elastic wave element portion and the second elastic wave element portion.

10. The manufacturing method for an elastic wave device according to claim 9, further comprising:
    a step of forming the second bump on the piezoelectric substrate to be electrically connected to the first electrode structure or the second electrode structure; wherein
    the second bump and the first bump are formed at the same time.

11. The manufacturing method for an elastic wave device according to claim 9, wherein the first bump and the second bump are made of a same material.

12. The manufacturing method for an elastic wave device according to claim 9, wherein a maximum diameter of the first bump is smaller than a maximum diameter of the second bump.

13. The manufacturing method for an elastic wave device according to claim 9, wherein the first bump is longer in one direction when viewed from above.

14. The manufacturing method for an elastic wave device according to claim 9, wherein the first bump is grounded.

15. The manufacturing method for an elastic wave device according to claim 9, further comprising providing a package substrate that is stacked on the piezoelectric substrate and bonded to the second bump.

16. The manufacturing method for an elastic wave device according to claim 9, further comprising forming at least one third elastic wave element portion on the piezoelectric substrate.

17. The manufacturing method for an elastic wave device according to claim 9, wherein the first elastic wave element portion defines a reception filter portion, and the second elastic wave element portion defines a transmission filter portion so as to provide a duplexer.

18. An elastic wave device comprising:
    a piezoelectric substrate;
    a first electrode structure provided on the piezoelectric substrate and defining a first elastic wave element portion;
    a second electrode structure provided on the piezoelectric substrate and defining a second elastic wave element portion;
    a first bump provided on the piezoelectric substrate between the first elastic wave element portion and the second elastic wave element portion, and configured of a conductive material to define a shield; and
    a second bump electrically connected to the first electrode structure or the second electrode structure to provide an electrical connection to an exterior; wherein
    a maximum diameter of the first bump is smaller than a maximum diameter of the second bump.

19. The elastic wave device according to claim 18, wherein the first bump and the second bump are made of a same material.

20. The elastic wave device according to claim 18, wherein the first bump is longer in one direction when viewed from above.

21. The elastic wave device according to claim 18, wherein the first bump is grounded.

22. The elastic wave device according to claim 18, further comprising a package substrate that is stacked on the piezoelectric substrate and bonded to the second bump.

23. The elastic wave device according to claim 18, wherein at least one third elastic wave element portion is configured on the piezoelectric substrate.

24. The elastic wave device according to claim 18, wherein the first elastic wave element portion defines a reception filter portion, and the second elastic wave element portion defines a transmission filter portion so as to provide a duplexer.

25. A manufacturing method for the elastic wave device according to claim 18, the method comprising:
- a step of preparing the piezoelectric substrate;
- a step of forming the first electrode structure and the second electrode structure on the piezoelectric substrate; and
- a step of forming the first bump of the conductive material on the piezoelectric substrate between the first elastic wave element portion and the second elastic wave element portion.

* * * * *